(12) United States Patent
Ghodsi

(10) Patent No.: US 8,345,478 B2
(45) Date of Patent: Jan. 1, 2013

(54) USE OF EMERGING NON-VOLATILE MEMORY ELEMENTS WITH FLASH MEMORY

(75) Inventor: Ramin Ghodsi, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 64 days.

(21) Appl. No.: 13/031,966

(22) Filed: Feb. 22, 2011

(65) Prior Publication Data

US 2011/0141813 A1    Jun. 16, 2011

Related U.S. Application Data

(63) Continuation of application No. 12/484,418, filed on Jun. 15, 2009, now Pat. No. 7,898,859.

(51) Int. Cl.
*G11C 16/00*    (2006.01)

(52) U.S. Cl. .................. 365/185.11; 365/49.1; 365/148; 365/157; 365/163; 365/185.08; 365/185.09; 365/189.2

(58) Field of Classification Search ................. 365/49.1, 365/189.2

See application file for complete search history.

(56) References Cited

U.S. PATENT DOCUMENTS

| | | | |
|---|---|---|---|
| 5,815,441 A | 9/1998 | Kobatake | |
| 6,611,459 B2 | 8/2003 | Shiromoto | |
| 7,245,527 B2 * | 7/2007 | Qureshi et al. | 365/171 |
| 7,298,649 B2 | 11/2007 | Mori et al. | |
| 7,516,344 B2 * | 4/2009 | Kato et al. | 713/322 |
| 7,778,065 B2 | 8/2010 | Lamorey et al. | |
| 7,787,297 B2 * | 8/2010 | Jeon et al. | 365/185.05 |
| 7,916,538 B2 * | 3/2011 | Jeon et al. | 365/185.05 |
| 7,940,582 B2 * | 5/2011 | Fekih-Romdhane | 365/200 |
| 7,952,956 B2 * | 5/2011 | Wang et al. | 365/230.09 |
| 2005/0050261 A1 * | 3/2005 | Roehr et al. | 711/103 |
| 2006/0256610 A1 | 11/2006 | Qureshi | |
| 2008/0181018 A1 * | 7/2008 | Nagadomi et al. | 365/185.25 |

* cited by examiner

*Primary Examiner* — Tan T. Nguyen
(74) *Attorney, Agent, or Firm* — Dickstein Shapiro LLP

(57) ABSTRACT

Memory devices and methods of operating memory devices are provided, such as those that involve a memory architecture that replaces typical static and/or dynamic components with emerging non-volatile memory (NV) elements. The emerging NV memory elements can replace conventional latches, can serve as a high speed interface between a flash memory array and external devices and can also be used as high performance cache memory for a flash memory array.

25 Claims, 10 Drawing Sheets

USE OF EMERGING NON-VOLATILE MEMORY ELEMENTS WITH FLASH MEMORY

This application is a continuation of U.S. patent application Ser. No. 12/484,418, filed Jun. 15, 2009 now U.S. Pat. No. 7,898,859, which is hereby incorporated by reference in its entirety.

FIELD OF THE INVENTION

Embodiments described herein relate to flash memory devices and more particularly to flash memory devices having emerging non-volatile (NV) memory elements used therewith.

BACKGROUND

Memory can generally be characterized as either volatile or non-volatile. Volatile memory, for example, most types of random access memory (RAM), requires constant power to maintain stored information. Non-volatile memory does not require power to maintain stored information. Various types of non-volatile memories include read only memories (ROMs), erasable programmable read only memories (EPROMs), and electrically erasable programmable read only memories (EEPROMs).

Flash memory is a type of EEPROM that is programmed and erased in blocks as opposed to cells. A conventional flash memory device includes a plurality of memory cells, each cell is provided with a floating gate covered with an insulating layer. There is also a control gate which overlays the insulating layer. Below the floating gate is another insulating layer sandwiched between the floating gate and the cell substrate. This insulating layer is an oxide layer and is often referred to as the tunnel oxide. The substrate contains doped source and drain regions, with a channel region disposed between the source and drain regions. In a flash memory device, a charged floating gate represents one logic state, e.g., a logic value "0", while a non-charged floating gate represents the opposite logic state e.g., a logic value "1". The flash memory cell is programmed by placing the floating gate into one of these charged states. Charges may be injected or written on to the floating gate by any number of methods, including e.g., avalanche injection, channel injection, Fowler-Nordheim tunneling, and channel hot electron (CHE) injection. The floating gate may be discharged or erased by any number of methods including e.g., Fowler-Nordheim tunneling. This type of flash memory element is a transistor-based non-volatile memory element.

The "NAND" and "NOR" architectures are two common types of flash memory architectures. NAND flash memory has gained widespread popularity over NOR flash memory because it can pack a greater number of storage cells in a given area of silicon, providing NAND with density and cost advantages over other nonvolatile memory. A NAND flash memory device typically utilizes a NAND flash controller to write data to the NAND in a page-by-page fashion. An example NAND memory array 10 is illustrated in FIG. 1. Pages 12 are typically grouped into blocks 14, where a block is the smallest erasable unit of the NAND flash memory device. For example, and without limitation, a typical NAND flash memory device contains 2,112 bytes of memory per page 12 and 64 or 128 pages of memory are contained in a block 14. FIG. 1 illustrates blocks 14 comprising 64 pages 12. For a page 12 having 2,112 bytes in total, there is a 2,048-byte data area 16 and a 64-byte spare area 18. The spare area 18 is typically used for error correction code (ECC), redundancy cells, and/or other software overhead functions. The smallest entity that can be programmed in the illustrated array 10 is a bit.

FIG. 2 illustrates a NAND flash memory device 110 having a memory array 120 and sense circuitry 130 connected to the memory array 120 by data lines, which are commonly referred to as bitlines (BL). The array 120 comprises typical transistor-based non-volatile flash memory elements. When data is to be written into the NAND memory array, the data is initially loaded into the sense circuitry 130. Once the data is latched, a programming operation is used to write a page of data into one of the pages of memory cells in the memory array 120. The sense circuitry 130 typically comprises volatile static or dynamic memory elements.

A simplified schematic of a portion of the sense circuitry 130 is illustrated in FIG. 3. As can be seen, there is sense operation circuitry 132 comprising three n-channel MOSFET transistors 134, 136, 138, a data latch 140, cache latch 150 and additional n-channel MOSFET transistors 160, 162, 164, 166, 168. The data latch 140 is illustrated as comprising cross-coupled inverters 142, 144. The cache latch 150 is illustrated as comprising cross-coupled inverters 152, 154. The inverters 142, 144, 152, 154 may each consist of e.g., an n-channel CMOS transistor and a p-channel CMOS transistor configured such that their gates are coupled together and at least one source/drain node of the n-channel transistor is coupled to a source/drain node of the p-channel transistor. Thus, the data and cache latches 140, 150 in the illustrated example are implemented as static memory elements, which would lose their contents if power were removed from the circuit. 130. Thus, a situation could arise where latched data could be lost if power to the array 110 (FIG. 2) were lost before the latched data was copied into the NAND memory arrays. Accordingly, the inventor of the present application appreciated that it would be desirable to prevent latched information from being lost in the event of a power failure or similar condition.

Continuing with the FIG. 3 example, data Da, Db is input into the sense circuitry 130 through the cache latch 150 when a data load/output enable signal data_load/out_en, connected to the gates of transistors 166, 168, is activated. Typically, data Da is the complement of data Db, and vice versa. A data signal Data connected at the gate of transistor 160 couples the data latch 140 to the cache latch 150. When the data signal Data is at a level that activates transistor 160, latched data is transferred from the cache latch 150 to the data latch 140. A verify enable signal, verify_en, is used to activate transistor 162, which is connected to transistor 164. The gate of transistor 164 is connected to the data latch 140. The same node of transistor 160 that is connected to the data latch 140 is also connected to a node of transistor 138 within the sense operation circuitry 132. A precharge enable signal, precharge_en, controls transistor 136 while a bitline sensing signal, blsn, controls transistor 134. A node of transistor 134 is connected to a write multiplexer (wmux) where data-to-be written, dw, based on the input data, is sent to and eventually stored in a conventional non-volatile memory array, which utilizes transistor-based memory elements.

As can be seen from the illustrated example, many transistors are required to implement the sense circuitry 130. It is desirable to reduce the circuitry used in sense circuitry 130. It is also desirable to increase the speed of sense circuitry 130.

DETAILED DESCRIPTION

Embodiments described herein refer to emerging NV (non-volatile memory elements). As used herein, and in accordance with the general understanding of one skilled in the relevant memory art, "emerging NV memory elements" means a non-transistor-based, non-volatile memory element such as phase change random access memory (PCRAM), magnetoresistive random access memory (MRAM), resistive random access memory (RRAM), ferroelectric random access memory (FeRAM), spin-transfer-torque random access memory (STTRAM), nano-tube memory, and equivalent non-volatile memory elements.

Figure 1:
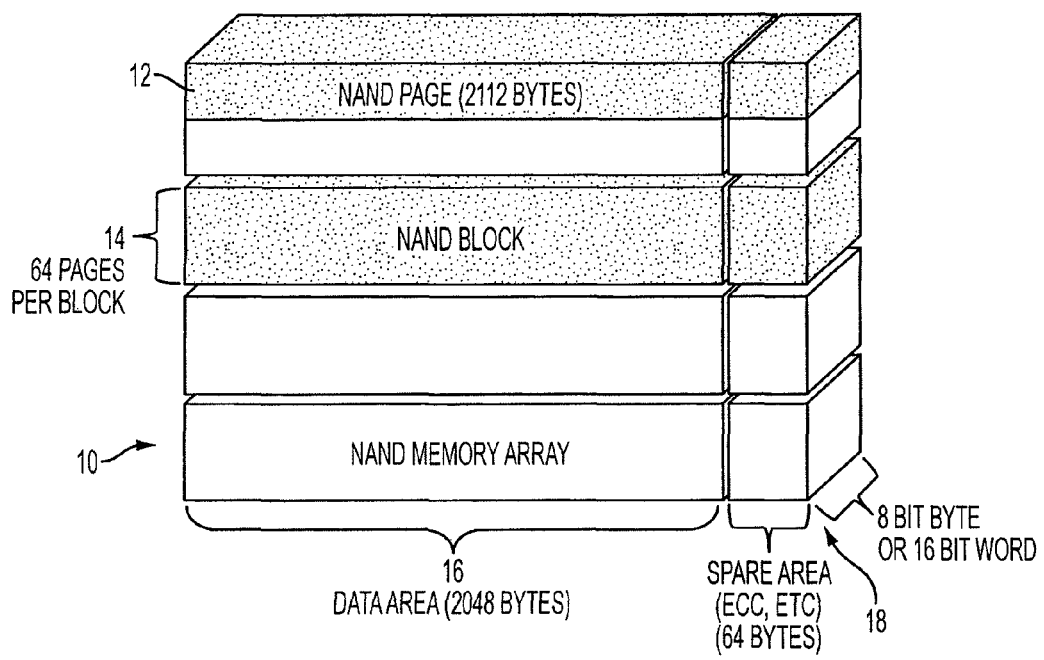
FIG. 1 illustrates an example NAND flash memory array.
Figure 2:
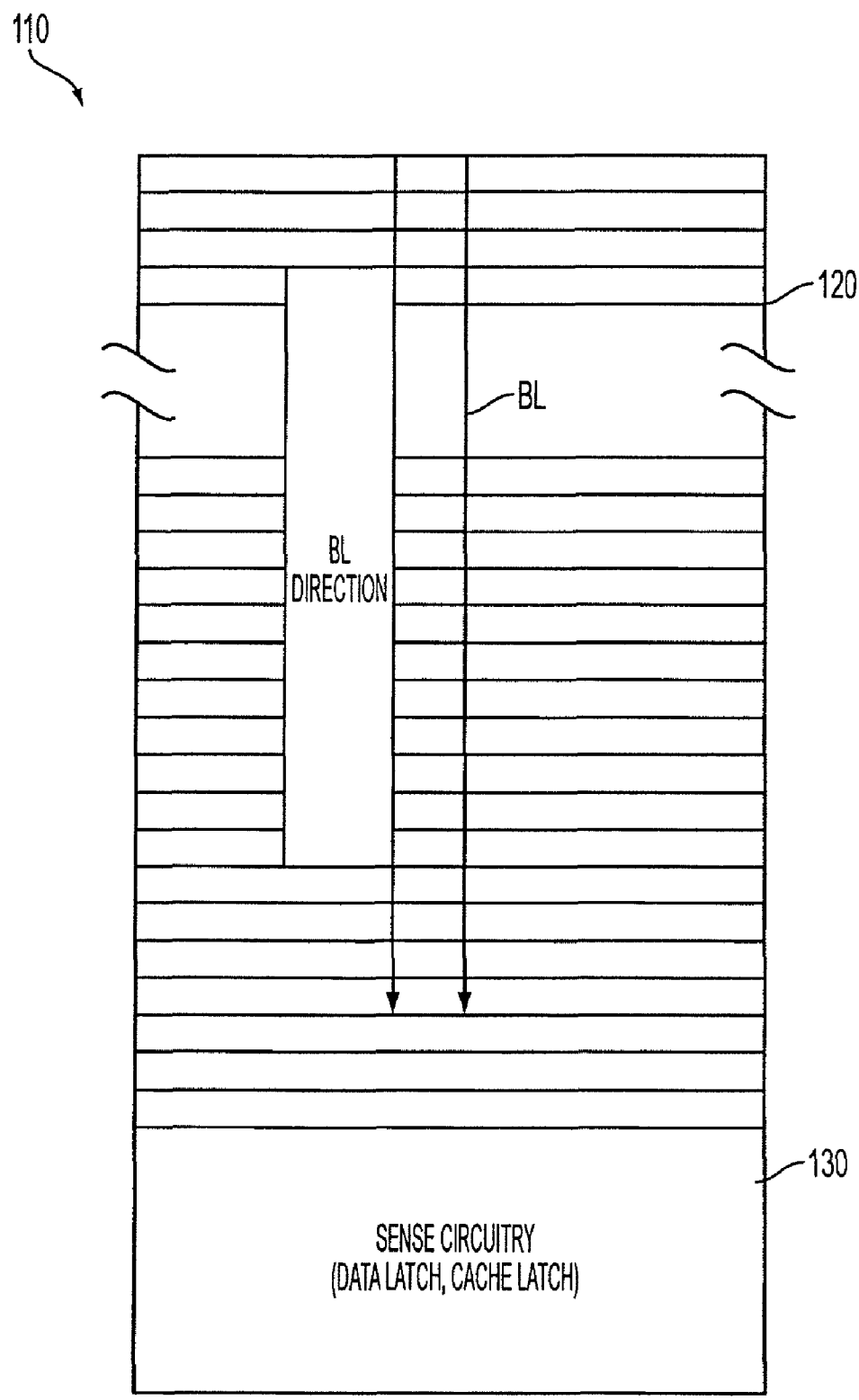
FIG. 2 illustrates an example NAND flash memory device having a memory array and sense circuitry.
Figure 3:
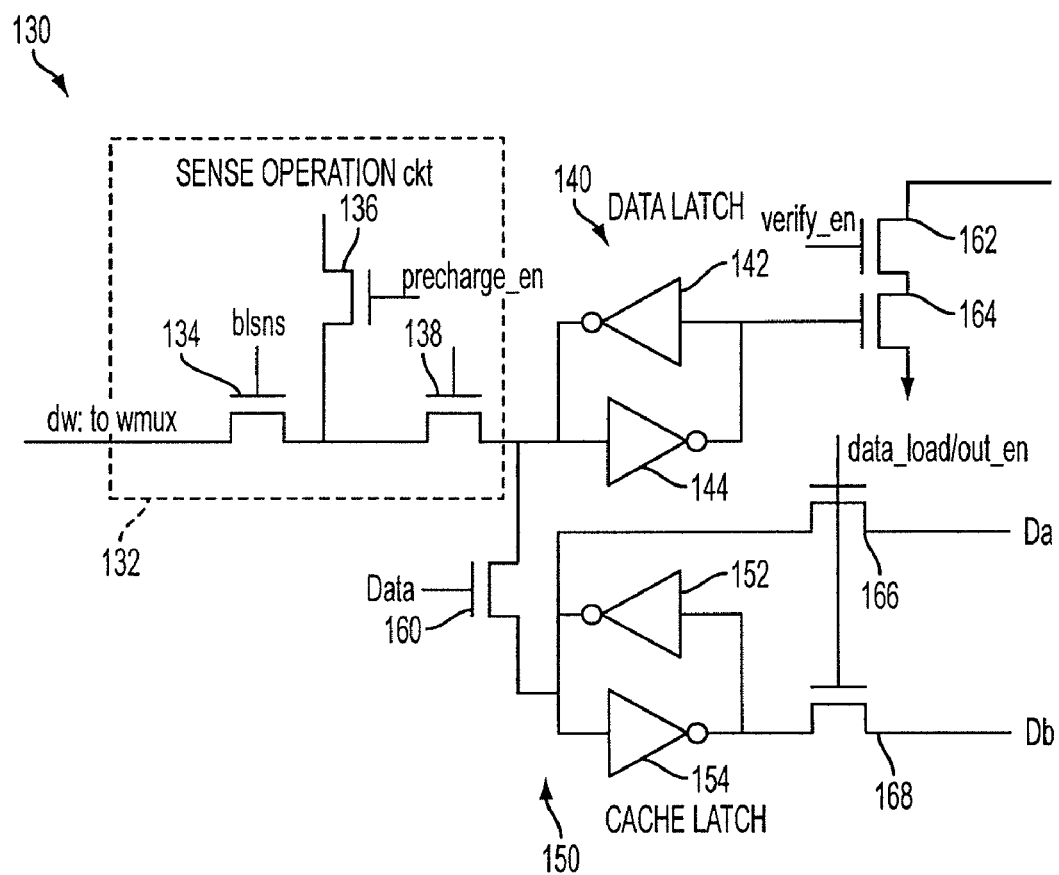
FIG. 3 illustrates a schematic view of the sense circuitry used in the array of FIG. 2.
Figure 4:
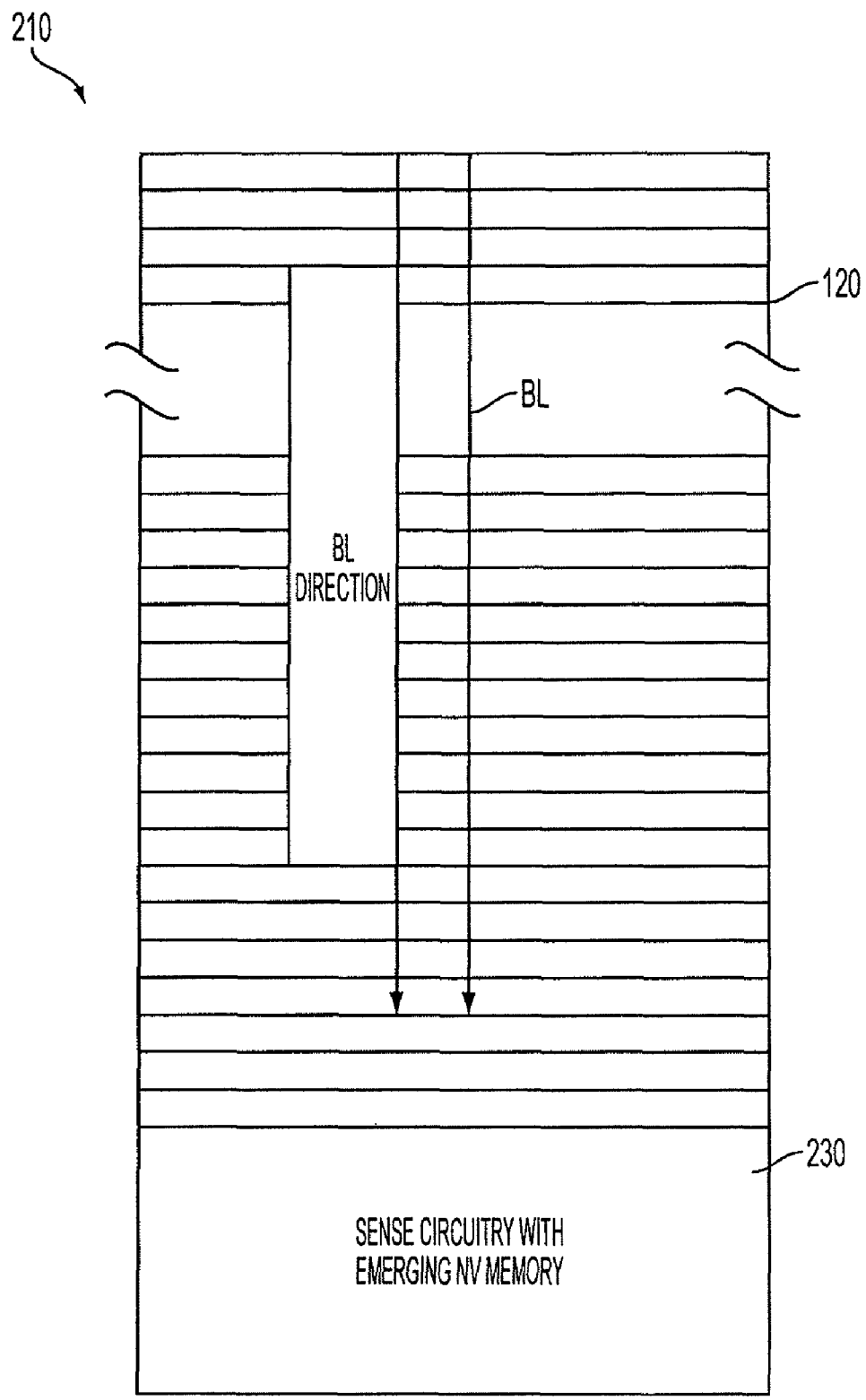
FIG. 4 illustrates an example flash memory device constructed in accordance with an embodiment described herein.

Referring to the figures, where like reference numbers designate like elements, FIG. 4 illustrates an example NAND flash memory device 210 constructed in accordance with an embodiment described herein. The device 210 includes a memory array 120 and sense circuitry including an emerging NV memory circuit 230 connected to the memory array 120 by bitlines (BL). The array 120 comprises typical transistor-based non-volatile flash memory elements. As will be discussed below in more detail, the flash memory device 210 differs from the conventional device 110 (FIG. 2) in that it includes emerging NV memory elements instead of the conventional cross-coupled inverters used in data and cache latches 140, 150 (FIG. 3). By replacing the latches with emerging NV memory elements, the illustrated embodiment can help prevent data loss during programming of the NAND memory array if power to the device 210 (or a device incorporating the device 210) is interrupted. In addition, in standby mode, power to the emerging memory could be cut off to reduce standby power consumption without loss of data. Due to their construction, the emerging NV memory elements are usually smaller than the conventional latches and could possibly be implemented in metal 1 and 2 layers of the flash memory device, giving them a smaller device footprint.

Figure 5:
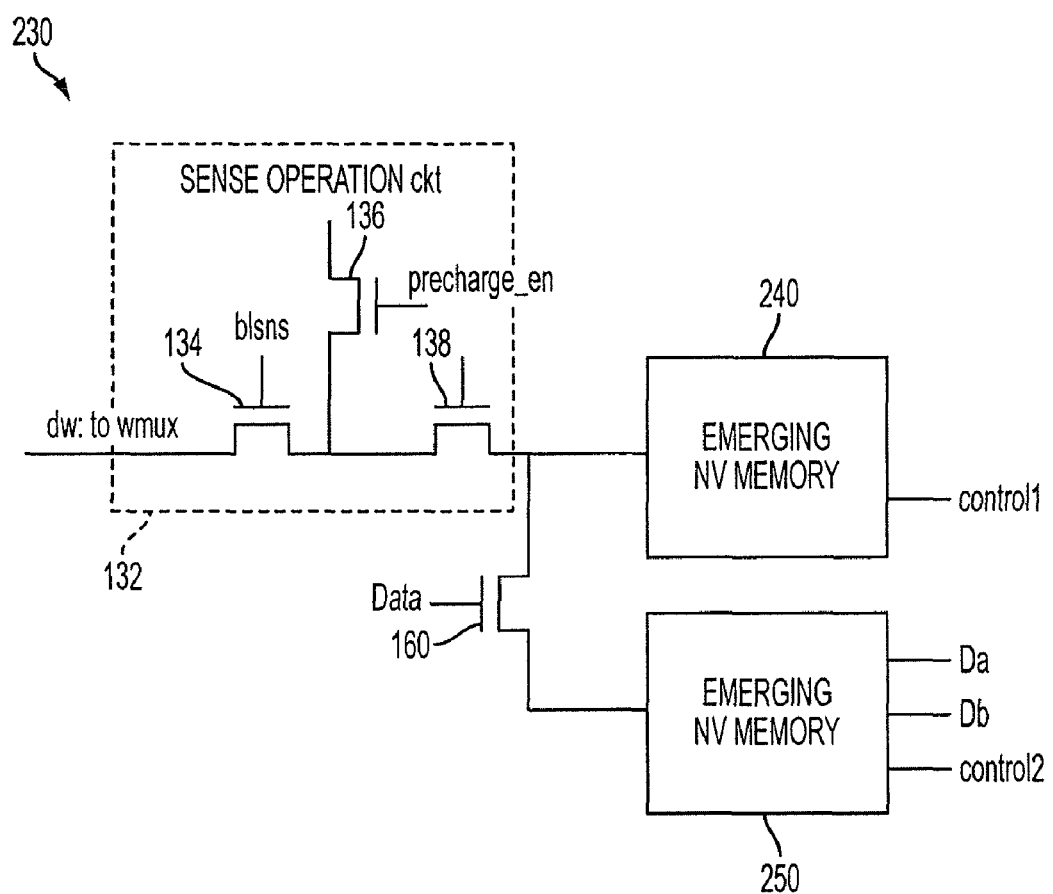
FIGS. 5 and 6 illustrate schematic views of example sense circuitry with emerging NV elements used in the array of FIG. 4.

A simplified schematic of an example portion of the sense circuitry with emerging NV memory elements 230 is illustrated in FIG. 5. As can be seen, there is sense operation circuitry 132 comprising three n-channel MOSFET transistors 134, 136, 138, which is the same as the sense operation circuitry 130 used in the conventional NAND device 110 (FIG. 3). In the illustrated embodiment, however, the cross-coupled inverters of data latch 140 and cache latch 150 are replaced with emerging NV memory circuits 240, 250. The first emerging NV memory circuit 240 is controlled by a first control signal (or signals) control1 and the second emerging NV memory circuit 250 is controlled by a second control signal (or signals) control2.

Data Da, Db is input into the sense circuitry 230 through emerging NV memory circuit 250 when control signal control2 is activated. Typically, data Da is the complement of data Db, and vice versa. A data signal Data connected at the gate of transistor 160 couples circuit 250 to circuit 240. When the data signal Data is at a level that activates transistor 160, the stored data is transferred from circuit 250 to circuit 240, which is controlled by control signal control 1. The same node of transistor 160 that is connected to circuit 240 is also connected to a node of transistor 138 within the sense operation circuitry 132. A precharge enable signal, precharge_en, controls transistor 136 while a bitline sensing signal, blsn, controls transistor 134. A node of transistor 134 is connected to a write multiplexer (wmux) where data-to-be written, dw, based on the input data, is sent to and eventually stored in a NAND memory array.

Figure 6:
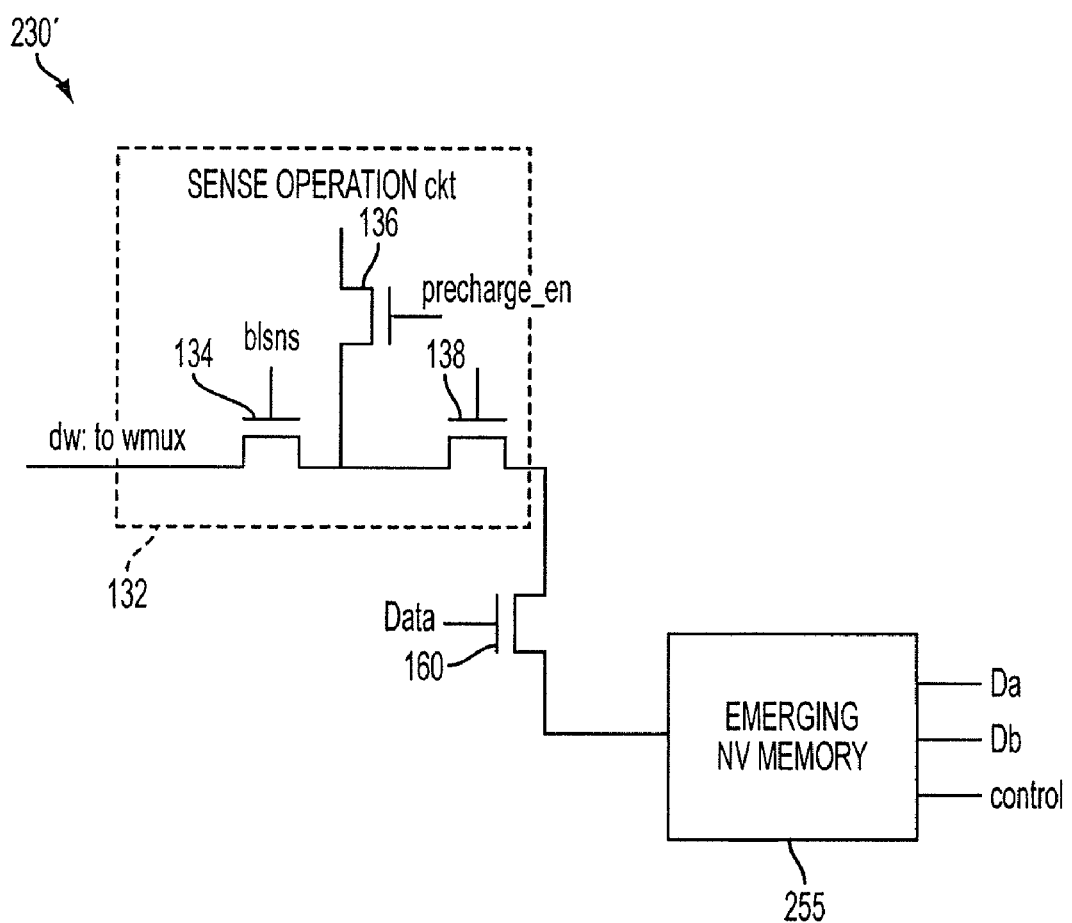

It should be appreciated that it may be desirable to reduce the number of emerging NV memory elements used in the sense circuitry 230. FIG. 6 illustrates a simplified schematic for another example of sense circuitry 230'. Circuitry 230' differs from circuitry 230 (FIG. 5) in that only one emerging NV memory circuit 255 is used to store data Da, Db before it is programmed into a NAND memory array. In the illustrated embodiment, the emerging NV memory circuit 255 is controlled by a control signal (or signals) control. It should also be appreciated that the emerging NV memory elements could be used with latches to provide additional functionality to the circuitry 230, 230', if desired.

It should also be appreciated that the illustrated control signals and input data may vary from the illustrated embodiment depending upon the type of emerging NV memory element used in the actual implementation of a device, such as device 210. That is, for example, a PCRAM memory element may require a different control signal than the control signal, used for an RRAM memory element. As such, the illustrated embodiments are not to be limited to the example number of control signals and data bits shown in FIGS. 5 and 6.

Figure 7:
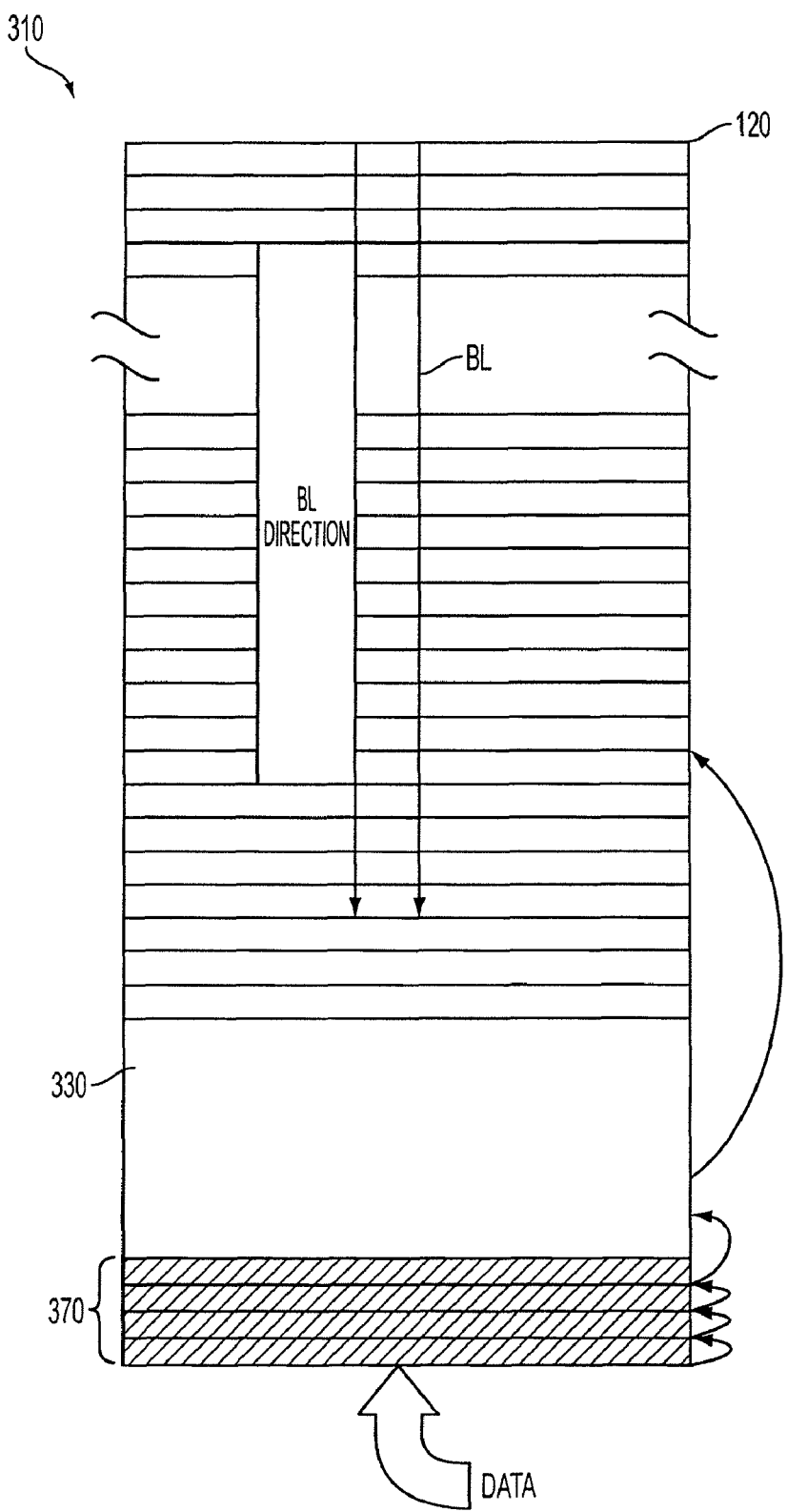
FIG. 7 illustrates an example flash memory device constructed in accordance with another embodiment described herein.

It should be appreciated that other benefits may be obtained by using emerging NV memory elements in other areas of, and to implement other functions in, a conventional memory device. For example, as illustrated in FIG. 7, one or more blocks of emerging NV memory elements 370 can be included within a device 310 that includes a conventional NAND array 120. The NV blocks 370 can be used, for example, to achieve faster writes from an external source of data. As such, the blocks of emerging NV memory elements 370 can serve as a high speed interface to the external source of data. Once the data is within one of the blocks of emerging NV memory elements 370, the data can be copied into other blocks 370 before it is stored in the NAND memory array 120 (either through the sense circuitry 330 as shown in FIG. 7 or without going through the sense circuitry 330). This way, the blocks 370 can also or alternatively serve as a high speed cache memory for the device 310. It could be desirable to use as many blocks of emerging NV memory elements 370 as the application design will allow. Accordingly, the illustrated embodiment is not to be limited to the example number of blocks of emerging NV memory elements 370 shown in FIG. 7.

It should be appreciated that better block management can be achieved by storing data in the blocks of emerging NV memory elements 370 prior to programming the NAND array 120 in the device 310. That is, fragment fixing, error correction and other data and memory cleaning operations can be performed while the data is in the faster emerging NV blocks 370. In addition, it is also possible to use some of the blocks 370 as redundant memory as part of the bad block management that is typically performed on flash memory devices. That is, the bad block management function of the flash memory device can replace bad blocks of memory elements in the NAND array 120 with a good block of emerging NV memory elements. The device 310 can be operated to map a bad NAND memory block to a block of emerging NV memory elements and then copy data (to be stored in the array 120) into the block of emerging NV memory elements.

It should also be appreciated that that emerging NV memory blocks could be used to initially store data so that required data adjustments can be performed before the data is stored in a NAND block. For example, there are times when an entire NAND block's data is needed to carry out adjustments to counter interference effects sometimes present in the NAND array. Once the adjustments are done in the emerging NV memory elements, then the data can be safely stored in the NAND block; thus, improving the NAND device's reliability.

Figure 8:
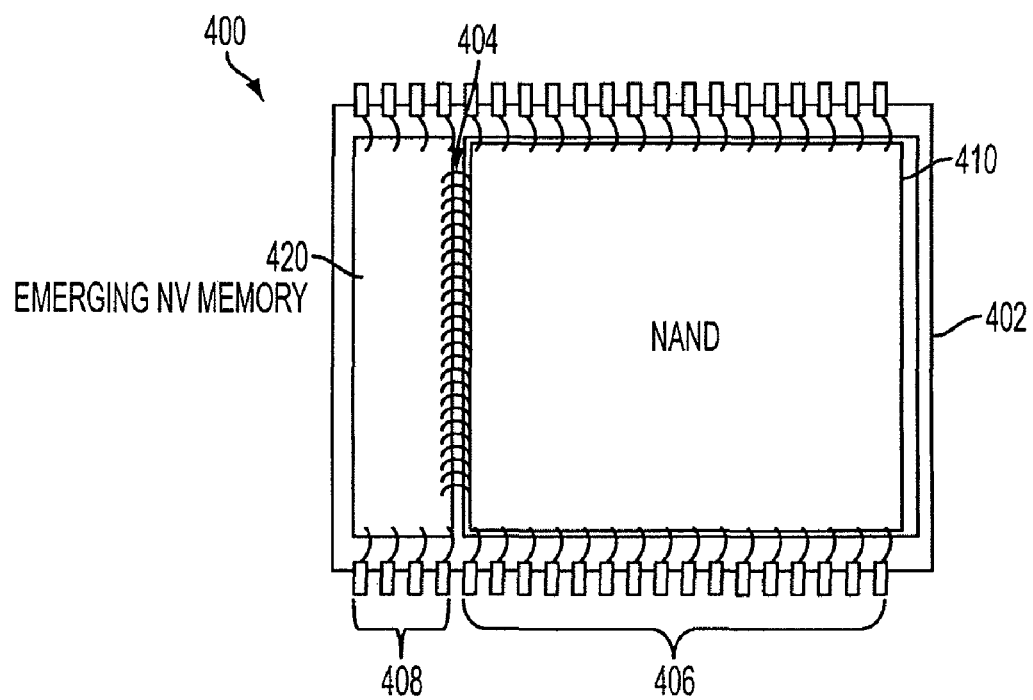
FIG. 8 illustrates an example flash memory module comprising an emerging NV cache constructed in accordance with an embodiment disclosed herein.

FIG. 8 illustrates a memory module 400 having a conventional NAND flash memory device 410 and an emerging NV cache memory 420 housed on the same circuit board 402. Bond wire connections 404 (or printed circuit board traces) may be placed along the sides of the flash memory device 410 die to connect it to the emerging NV cache memory device 420. The module 400 also includes pins 406 serving as an interface to the conventional device 410 and for providing ground and power to the device 410, and pins 408 serving as an interface to the emerging NV cache memory device 420 and for providing ground and power to the device 420. It should be appreciated that the number of pins and connections shown in FIG. 8 is only an example number of pins and connections and that the actual implementation of the module 400 could have more or less pins and connections. In the illustrated embodiment, the emerging NV cache memory device 420 can serve as a high performance non-volatile cache for the flash device 410, which provides the data loss prevention and other advantages described above. Although not shown, the circuit board 402 could also include a memory controller; in such a case, the module 400/circuit board 402, could be used as a cache for a cheaper storage device such e.g., as a hard drive.

Figure 9:
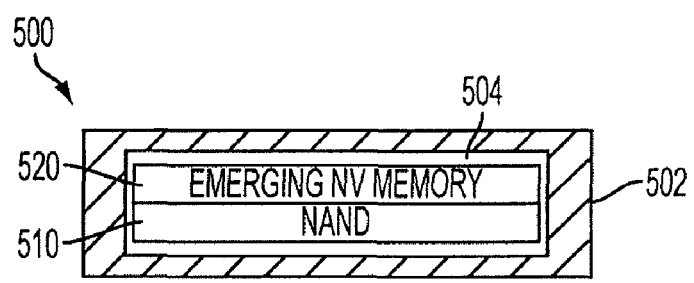
FIG. 9 illustrates example packaging of an emerging NV cache chip stacked with a flash memory chip constructed in accordance with an embodiment disclosed herein.

FIG. 9 illustrates a memory chip package 500 comprising an encasement 502 having a cavity 504 where in an emerging NV cache 520 is stacked with a NAND flash memory device 510. As with other embodiments, the emerging NV cache 520 can serve as a high performance non-volatile cache for the NAND flash device 510, which could provide the data loss prevention and other advantages described above.

Figure 10:
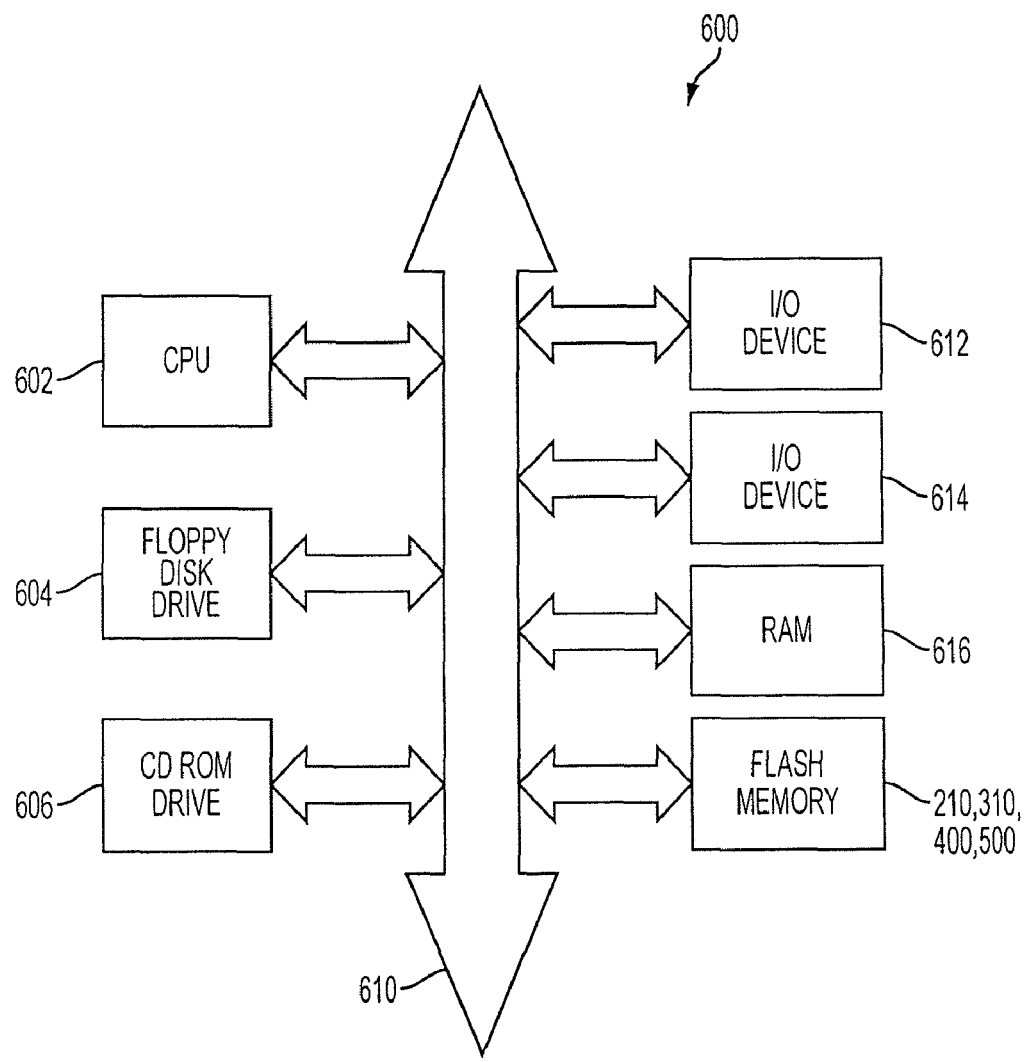
FIG. 10 shows a processor system incorporating at least one flash memory device constructed in accordance with an embodiment disclosed herein.

FIG. 10 illustrates a processor system 600 utilizing a memory device, e.g., a flash memory device 210, 310, 400, 500 constructed in accordance with embodiments described above. That is, the memory device 210, 310, 400, 500 is a NAND flash memory device incorporating one or more emerging NV memory elements as set described above. The system 600 may be a computer system, camera system, personal digital assistant (PDA), cellular telephone, smart telephone, a process control system or any system employing a processor and associated memory. The system 600 includes a central processing unit (CPU) 602, e.g., a microprocessor, that communicates with the flash memory 210, 310, 400, 500 and an I/O device 612 over a bus 610. It must be noted that the bus 610 may be a series of buses and bridges commonly used in a processor system, but for convenience purposes only, the bus 610 has been illustrated as a single bus. A second I/O device 614 is illustrated, but is not necessary to practice the embodiments described above. The system 600 also includes random access memory device 616 and may include a read-only memory device (not shown), and peripheral devices such as a floppy disk drive 604 and a compact disk (CD) ROM drive 606 that also communicate with the CPU 602 over the bus 610 as is well known in the art.

Figure 11:
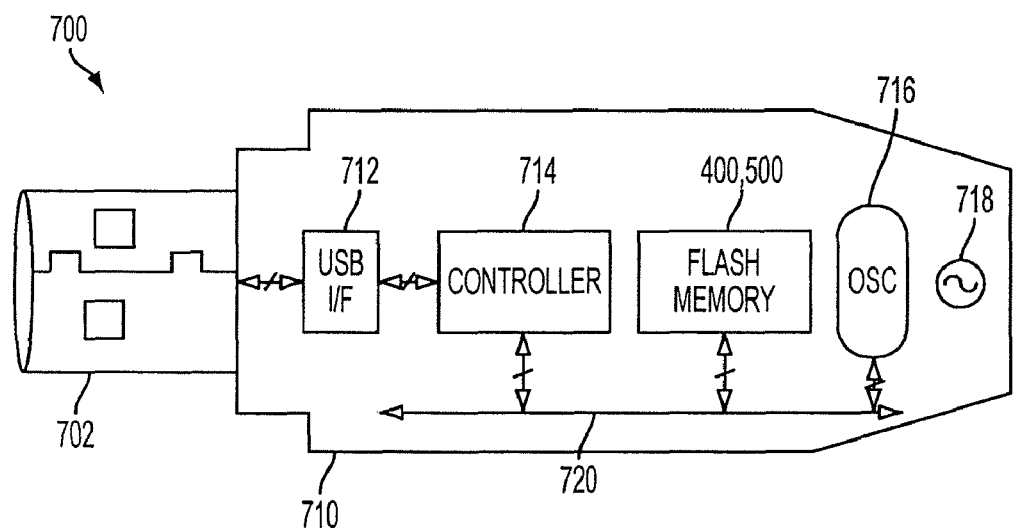
FIG. 11 shows a universal serial bus (USB) memory device incorporating at least one flash memory device constructed in accordance with an embodiment disclosed herein.

FIG. 11 shows a universal serial bus (USB) memory device 700 incorporating at least one flash memory device 400, 500 constructed in accordance with an embodiment disclosed herein. The device 700 includes a USB connector 702 electrically and mechanically connected to a printed circuit board 710. The connector 702 allows the device 700 to be inserted within a USB port of a computer or other device to allow data to be exchanged between the device 700 and the computer, etc. Moreover, power for the device 700 will also come from the USB port. The printed circuit board 710 comprises a USB interface (I/F) chip 712 electrically connected to the USB connector 702. The USB interface 712 is electrically connected to and communicates with a controller 714. The controller 714 controls and communicates with the flash memory device 400, 500 over a bus 720. The controller 714 also controls a light emitting diode 718, via the bus 720. Typically, the light emitting diode 718 is controlled to blink when the flash memory device 400, 500 is being accessed. FIG. 11 also illustrates an oscillator 716, which is used as a clock for the device 700.

It should be appreciated that, although the embodiments have been described as using NAND flash memory arrays, other types of non-volatile flash memory could be used to practice the embodiments. For example, NOR and AND type flash memory arrays could be used in any of the illustrated embodiments. It should also be appreciated that the emerging NV memory elements can also be used to store data that has been read out of the conventional memory cells. In addition, it should be appreciated that the emerging NV memory elements can be used to store trim and fuse information as well as diagnostic data (e.g., program time, erase time, cycling information, number of failed bits or blocks) that can be acquired through out the life of the NAND chip regarding its performance and reliability.

The above description and drawings illustrate various embodiments It should be appreciated that modifications, though presently unforeseeable, of these embodiments that can be made without departing from the spirit and scope of the claimed invention, which is defined by the following claims.

What is claimed as new and desired to be protected by Letters Patent of the United States is:

1. A memory device comprising:
    an array of transistor-based non-volatile memory having emerging non-volatile memory for storing programming data into the array using sense circuitry.

2. The device of claim 1, wherein the emerging non-volatile memory comprises phase change memory.

3. The device of claim 1, wherein the emerging non-volatile memory comprises magnetoresistive memory.

4. The device of claim 1, wherein the emerging non-volatile memory comprises resistive memory.

5. The device of claim 1, wherein the emerging non-volatile memory comprises ferroelectric memory.

6. The device of claim 1, wherein the emerging non-volatile memory comprises spin-transfer-torque memory.

7. The device of claim 1, wherein the emerging non-volatile memory comprises nano-tube memory.

8. The device of claim 1, wherein the array comprises a NAND flash memory array and is organized into a plurality of blocks having a block size, and wherein the emerging non-volatile memory is organized into at least one block having the block size.

9. The device of claim 1, wherein bit lines of the emerging non-volatile memory connects to bit lines of the array of transistor-based non-volatile memory.

10. The device of claim 1, wherein the emerging non-volatile memory stores blocks of data.

11. The device of claim 10, wherein the emerging non-volatile memory stores blocks of data through the sense circuitry.

12. The device of claim 10, wherein the blocks of data are used as cache memory.

13. A flash memory device comprising:
an array of first emerging non-volatile memory cells, the array being organized into a plurality of memory blocks, each memory block comprising a plurality of memory pages; and
a cache memory circuit electrically coupled to the array, the cache memory circuit comprising a second emerging non-volatile memory element for storing programming data in the array of first emerging non-volatile memory cells, wherein the second emerging non-volatile memory element being organized into at least one memory block.

14. The flash memory device of claim 13, wherein the array and the cache memory circuit are in a same module.

15. The flash memory device of claim 13, wherein the array and the cache memory circuit are on a same circuit board.

16. The flash memory device of claim 13, wherein the cache memory circuit is stacked with the array in a same chip package.

17. A circuit comprising:
circuitry coupled to an array of first non-volatile memory elements, the circuitry comprising one second emerging non-volatile memory element and a sense circuit, wherein programming data from the one second emerging non-volatile memory element is stored in the array of first non-volatile memory elements via the sense circuit.

18. The circuit of claim 17, wherein the array and the circuitry are in a same module.

19. The circuit of claim 17, wherein the array and the circuitry are on a same circuit board.

20. The circuit of claim 17, wherein the array is organized into a plurality of blocks having a block size, and wherein the one second emerging non-volatile memory element is organized into a block having the block size.

21. The circuit of claim 17, wherein the one second emerging non-volatile memory element comprises a phase change memory element.

22. The circuit of claim 17, wherein the one second emerging non-volatile memory element comprises a resistive memory element.

23. A method comprising:
storing data in a plurality of blocks of emerging non-volatile memory;
programming an array of non-volatile memory cells; and
mapping a defective set of memory blocks with the array of non-volatile memory cells and replacing them with the plurality of blocks of emerging non-volatile memory.

24. The method of claim 23, further comprising the step of using the plurality of blocks of emerging non-volatile memory as redundant memory blocks.

25. A method comprising:
storing data in a plurality of blocks of emerging non-volatile memory;
programming array of non-volatile memory cells; and
performing a memory cleaning operation while the data is stored in the plurality of blocks of emerging non-volatile memory before it is programmed into the array of non-volatile memory cells.

* * * * *

UNITED STATES PATENT AND TRADEMARK OFFICE
CERTIFICATE OF CORRECTION

PATENT NO. : 8,345,478 B2
APPLICATION NO. : 13/031966
DATED : January 1, 2013
INVENTOR(S) : Ramin Ghodsi It is certified that error appears in the above-identified patent and that said Letters Patent is hereby corrected as shown below:

In column 7, line 33, in Claim 13, delete "cells," and insert -- cells using a sense circuitry, --, therefor.

In column 8, line 36, in Claim 25, after "programming" insert -- an --.

Signed and Sealed this
Twenty-sixth Day of March, 2013

Teresa Stanek Rea
*Acting Director of the United States Patent and Trademark Office*